(12) United States Patent
Tripathi et al.

(10) Patent No.: US 7,187,197 B2
(45) Date of Patent: Mar. 6, 2007

(54) TRANSMISSION LINE DRIVER

(75) Inventors: Divya Tripathi, Bhopal (IN); Qadeer A. Khan, New Delhi (IN); Kulbhushan Misri, Haryana (IN)

(73) Assignee: Freescale Semiconductor, Inc., Austin, TX (US)

( * ) Notice: Subject to any disclaimer, the term of this patent is extended or adjusted under 35 U.S.C. 154(b) by 220 days.

(21) Appl. No.: 11/098,108

(22) Filed: Apr. 4, 2005

(65) Prior Publication Data

US 2006/0220675 A1    Oct. 5, 2006

(51) Int. Cl.
   H03K 5/12       (2006.01)
   H03K 19/094     (2006.01)
   H03K 3/00       (2006.01)

(52) U.S. Cl. .................. 326/29; 326/87; 327/112; 327/170

(58) Field of Classification Search ............. 326/29, 326/83, 86, 87; 327/108, 112, 170
   See application file for complete search history.

(56) References Cited

U.S. PATENT DOCUMENTS 6,271,699 B1     8/2001   Dowlatabadi
6,617,897 B2     9/2003   Lee
7,053,713 B1 *   5/2006   Dening ........................ 330/276
2006/0267641 A1* 11/2006  Khan et al. ................. 327/108

OTHER PUBLICATIONS

Ahmad B. Dowlatabadi, A Robust, Load Insensitive Pad Driver, IEEE Journal of Solid State Circuits, Apr. 2000, pp. 600-665, vol. 35, No. 4, USA.
Hwang, Cheng Chow and Chen, Yi Huang, Novel Output Buffer Design for USB Applications, The Second IEEE Asia Pacific Conference on ASICs, 2000, pp. 69-72, USA.

* cited by examiner

*Primary Examiner*—Daniel Chang
(74) *Attorney, Agent, or Firm*—Charles Bergere

(57) ABSTRACT

A transmission line driver with slew rate control includes high and low side ramp generators for generating charge and discharge ramp signals, respectively, which are input to respective comparators and a pair of source follower transistors. A pair of additional transistors is connected to the pair of source follower transistors and a pair of staggered drivers is connected to the pair of additional transistors.

17 Claims, 3 Drawing Sheets

TRANSMISSION LINE DRIVER

BACKGROUND OF THE INVENTION

The present invention relates generally to integrated circuits and, more particularly, to driver circuits for integrated circuit pads.

Integrated circuits process input signals and generate output signals. To communicate with the outside world, integrated circuits have I/O pads, which allow for connection to external devices. Thus, integrated circuits usually include both a data transmitter, or driver circuit, and a receiver circuit. Communicating data signals can be complicated and is the subject of extensive studies relating to transmission lines. To reduce data signal ringing and signal interference, the rise time or slew rate of a signal transmitted on a bus is often controlled.

Accordingly, it is an object of the present invention to provide a transmission line driver with slew rate control.

BRIEF DESCRIPTION OF THE DRAWINGS

The following detailed description of a preferred embodiment of the invention will be better understood when read in conjunction with the appended drawings. The present invention is illustrated by way of example and not limited by the accompanying figures, in which like references indicate similar elements.

DETAILED DESCRIPTION OF THE INVENTION

Figure 1:
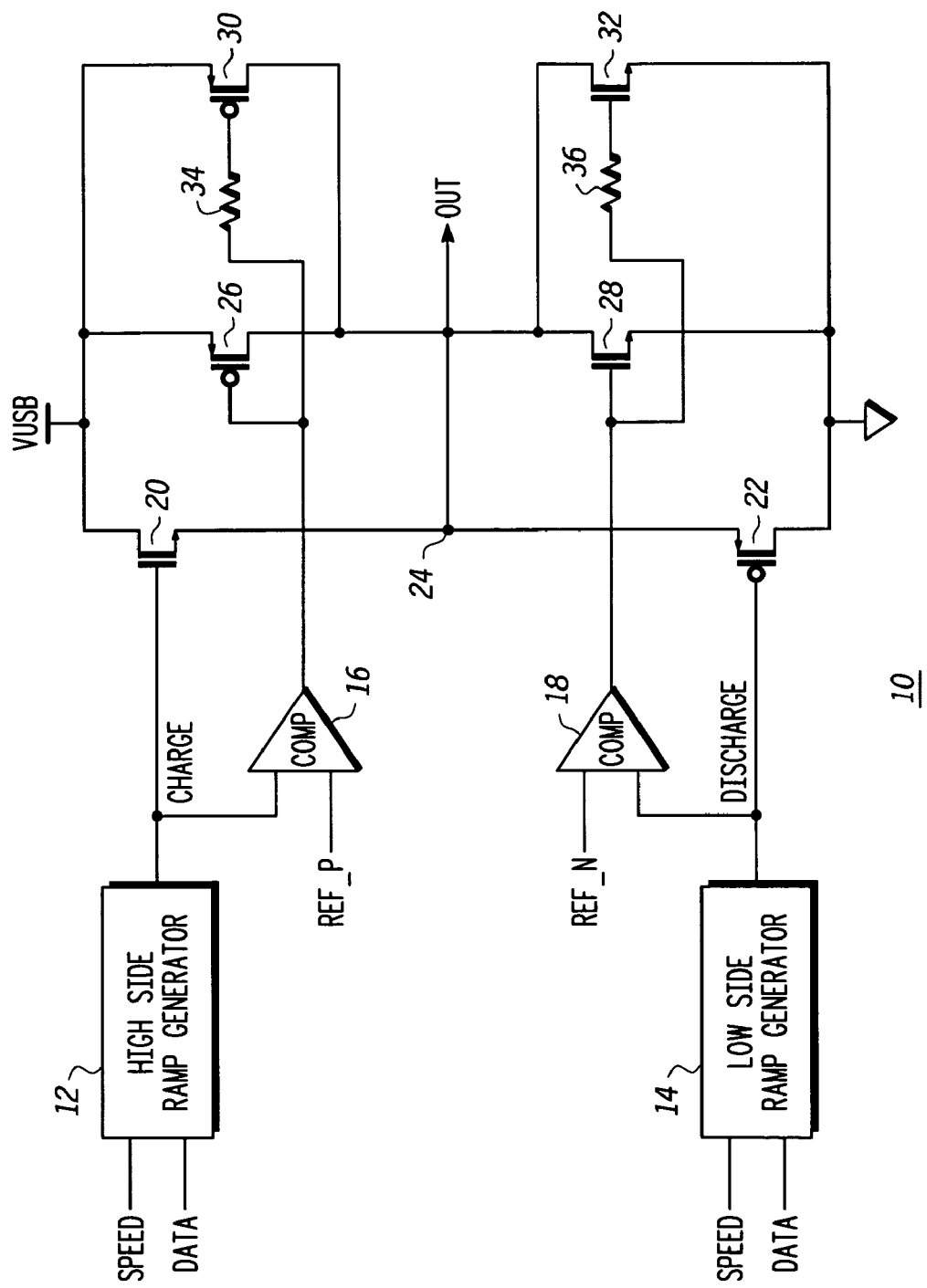
FIG. 1 is a schematic circuit diagram of a transmission line driver in accordance with the present invention.

The detailed description in connection with the appended drawings is intended as a description of one embodiment of the invention, and is not intended to represent the only form in which the present invention may be practiced. It is to be understood that the same or equivalent functions may be accomplished by different embodiments that are intended to be encompassed within the spirit and scope of the invention.

The present invention provides a transmission line driver with slew rate control including a high side ramp generator that receives a speed signal and a data signal and generates a charge ramp signal and a low side ramp generator that receives the speed signal and the data signal and generates a discharge ramp signal. Respective first and second comparators are connected to the high and low side ramp generators, receiving the charge and discharge ramp signals in first inputs and respective first and second reference voltages signals in second inputs, and generating first and second comparator output signals. An NMOS source follower transistor has a gate connected to the high side ramp generator and receives the charge ramp signal, and a drain thereof is connected to a first voltage level. A PMOS source follower transistor has a gate connected to the low side ramp generator and receives the discharge ramp signal. A drain thereof is connected to a ground, and a source thereof is connected to a source of the NMOS source follower transistor. A node between the sources of the NMOS and PMOS source follower transistors is an output node. A pair of additional drivers includes a PMOS transistor having a gate connected to the first comparator and receiving the first comparator output signal, and a source connected to the first voltage level, and a NMOS transistor having a gate connected to the second comparator and receiving the second comparator output signal, a source connected to the ground, and a drain connected to a drain of the PMOS additional transistor and the output node. A pair of staggered drivers includes a PMOS transistor having a gate connected to the first comparator and receiving the first comparator output signal, a source connected to the first voltage level, and a drain connected to the output node, and a NMOS transistor having a gate connected to the second comparator and receiving the second comparator output signal, a source connected to the ground, and a drain connected to the output node.

The present invention is useful for I/O drivers requiring slew rate control, such as full and low speed USB transmitters.

The transmission line driver uses a source follower topology for fixing the rise and fall time independent of load capacitance. The rise and fall time of the output is set by the rise and fall time of constant slew rate ramp signals, which are generated by charging fixed capacitors with constant current sources. The charge and discharge ramp signals are applied to gates of source follower NMOS and PMOS transistors, respectively. The source nodes are charged only up to a voltage Vdd-Vt and discharged to Vt. The additional drivers are used to charge and discharge the output completely. The additional drivers are initially off and get switched on only after the output voltage reaches a fixed threshold level. The staggered drivers are used for further controlling the slew rate of the additional drivers.

Referring now to FIG. 1, a schematic circuit diagram of a transmission line driver 10 in accordance with the present invention is shown. The transmission line driver 10 receives a data input signal (data) and provides an output signal (out) at an output node. The embodiment of the invention shown is for a Universal Serial Bus (USB) driver. A transmission line driver 10 also has a speed input signal that controls a mode of operation of the driver 10. That is, the driver 10 has a high speed mode and a low speed mode. For the USB, the high speed mode is 12 Mbps and the low speed mode is 1.5 Mbps. In the embodiment shown, when speed equals one, the driver 10 is in high speed mode and when speed equals zero, the driver 10 is in low speed mode.

The driver 10 includes a high side ramp generator 12 that receives the speed signal and the data signal and generates a charge ramp signal, and a low side ramp generator 14 that receives the speed signal and the data signal and generates a discharge ramp signal. The charge and discharge ramp signals generated by the high and low side ramp generators 12, 14 are substantially constant slew rate ramp signals generated by charging and discharging fixed capacitors with constant current sources, as will be discussed in more detail below.

A first comparator 16 is coupled to the high side ramp generator 12 and a second comparator 18 is coupled to the low side ramp generator 14. The first comparator 16 has a first input that receives the charge ramp signal, a second input that receives a first reference voltage signal (ref_p), and generates a first comparator output signal at an output terminal thereof. Similarly, the second comparator 18 has a first input that receives the discharge ramp signal, a second input that receives a second reference voltage signal (ref_n), and generates a second comparator output signal at an output thereof.

A NMOS source follower transistor 20 has a gate connected to the high side ramp generator 12 and receives the charge ramp signal. A drain of the NMOS source follower transistor 20 is connected to a first voltage level (VUSB). The NMOS source follower transistor 20 may also have a bulk connected to its source or ground. A PMOS source follower transistor 22 has a gate connected to the low side ramp generator 14 and receives the discharge ramp signal. A drain of the PMOS source follower transistor 22 is connected to a ground, and a source is connected to a source of the NMOS source follower transistor 20. The PMOS source follower transistor 22 also has a bulk connected to its source. Alternatively, the bulk of the PMOS transistor 22 could be connected to the first voltage level (VUSB). A node between the sources of the NMOS and PMOS source follower transistors 20, 22 is an output node 24.

A pair of additional drivers includes a PMOS transistor 26 and a NMOS transistor 28. The PMOS transistor 26 has a gate connected to the output of the first comparator 16 and receives the first comparator output signal, a source connected to the first voltage level (VUSB) and a drain. The NMOS transistor 28 has a gate connected to the output of the second comparator 18 and receives the second comparator output signal, a source connected to the ground, and a drain connected to the drain of the PMOS additional transistor 26 and the output node 24.

A pair of staggered drivers including a PMOS transistor 30 and a NMOS transistor 32 is coupled to the additional drivers. The PMOS staggered driver transistor 30 has a gate connected to the output of the first comparator 16 by way of a first resistor 34 and receives the first comparator output signal, a source connected to the first voltage level (VUSB) and a drain. The NMOS staggered driver transistor 32 has a gate connected to the output of the second comparator 18 by way of a second resistor 36 and receives the second comparator output signal, a source connected to the ground, and a drain connected to the drain of the PMOS staggered driver transistor 30 and the output node 24.

In the embodiment of the invention shown, the transmission line driver is used as a USB driver. In such an embodiment, the first and second resistors 34 and 36 are about 1 kΩ each, the first reference voltage signal is about 2.6 V and the second reference voltage signal is about 660 mV.

Figure 2:
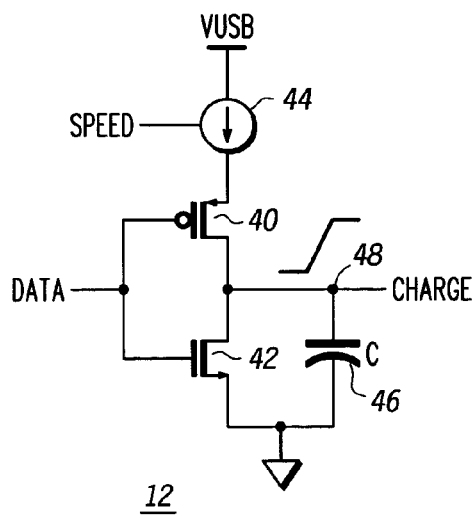
FIG. 2 is a schematic circuit diagram of a high side ramp generator of FIG. 1.

Referring now to FIG. 2, a schematic circuit diagram of the high side ramp generator 12 is shown. The high side ramp generator 12 includes a PMOS transistor 40 having a gate that receives the data signal, a source, and a drain, and a NMOS transistor 42 having a source connected to the ground, a gate that receives the data signal, and a drain connected to the drain of the PMOS transistor 40. A current source 44 is connected between the first voltage level (VUSB) and the source of the PMOS transistor 40. A capacitor 46 has a first terminal connected to a node 48 between the drains of the PMOS and NMOS transistors 40 and 42, and a second terminal connected to the source of the NMOS transistor 42. The charge ramp signal is generated at the node 48.

Figure 4:
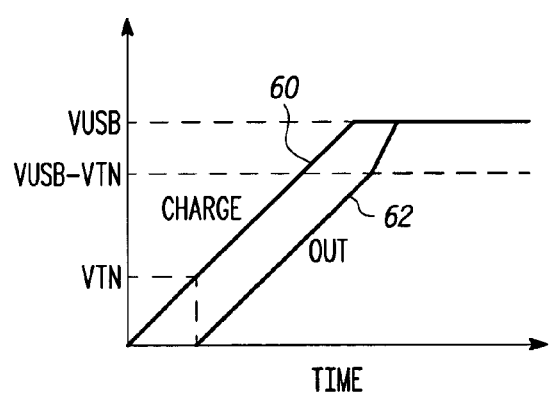
FIG. 4 is a graph illustrating an output waveform of the high side ramp generator of FIG. 2.

FIG. 4 is a graph illustrating an output waveform (the charge ramp signal) of the high side ramp generator 12. The graph shows the driver 10 output and the ramp generator 12 charge signal. As illustrated, the driver 10 output follows the charge signal with a difference of Vtn (NMOS transistor threshold voltage). After the charge signal reaches the first reference voltage (Vref_p), the secondary PMOS transistors 26 and 30, are turned ON to charge the output node 24 to the first output level (VUSB). The first reference voltage Vref_p should be less than or equal to the first voltage level (VUSB)–Vtn.

Figure 3:
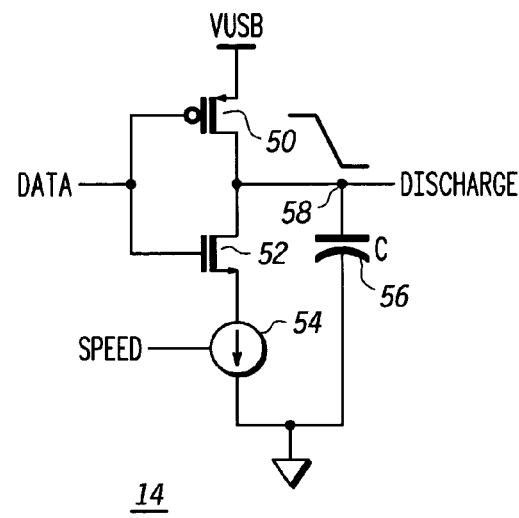
FIG. 3 is a schematic circuit diagram of a low side ramp generator of FIG. 1.

Referring now to FIG. 3, a schematic circuit diagram of the low side ramp generator 14 is shown. The low side ramp generator 14 includes a PMOS transistor 50 having a gate that receives the data signal and a source connected to the first voltage level (VUSB). A NMOS transistor 52 is connected to the PMOS transistor 50. More particularly, a drain of the NMOS transistor 52 is connected to a drain of the PMOS transistor 50, and the gate of the NMOS transistor 52, like that of the PMOS transistor 50, receives the data signal. A current source 54 is connected between a source of the NMOS transistor 52 and ground. A capacitor 56 has a first terminal connected to a node 58 between the drains of the PMOS and NMOS transistors 50 and 52, and a second terminal connected to ground. The discharge ramp signal is generated at the node 58 between the drains of the PMOS and NMOS transistors 50 and 52.

Figure 5:
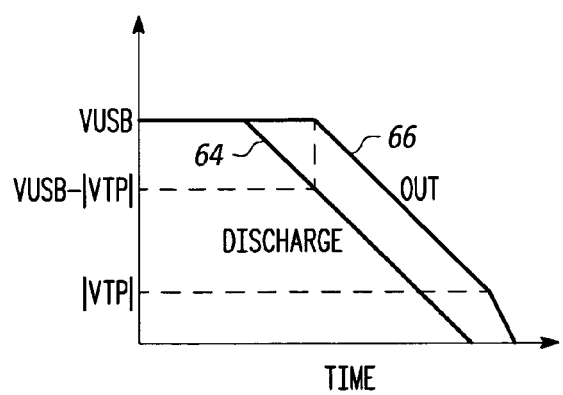
FIG. 5 is a graph illustrating an output waveform of the low side ramp generator of FIG. 3.

FIG. 5 is a graph illustrating an output waveform (the discharge ramp signal) of the low side ramp generator 14. The graph shows the driver 10 output and the ramp generator 14 discharge signal. As illustrated, the driver 10 output follows the discharge signal with a difference of Vtp (PMOS transistor threshold voltage). After the discharge signal reaches the second reference voltage (Vref_n), the secondary NMOS transistors 28 and 32, are turned ON to discharge the output node 24 to the ground voltage level. The second reference voltage Vref_n should be greater than or equal to |Vtp|.

Figure 6:
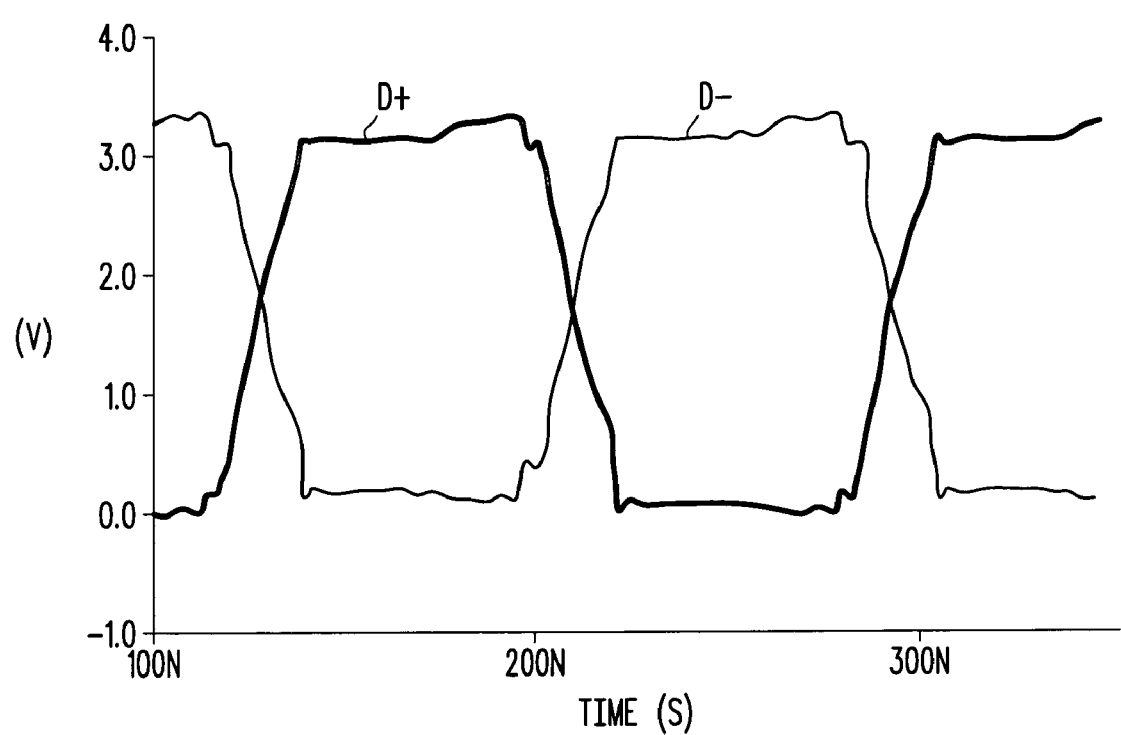
FIG. 6 is a waveform diagram illustrating an output waveform of the transmission line driver of FIG. 1 in a high speed mode of operation.

FIG. 6 is a waveform diagram illustrating an output waveform of the transmission line driver of FIG. 1 in a USB high speed mode of operation. The waveforms are the output of the transmitter operating at 12 Mbps with a ninety (90) ohm differential transmission line connected at the output. As illustrated, rise-fall matching and crossover voltage are maintained within specified USB standards across all corners of the rise and fall times. Since the transmission line driver 10 does not receive feedback, it is suitable for use where load independent slew rate control is required.

While various embodiments of the invention have been illustrated and described, it will be clear that the invention is not limited to these embodiments only. Numerous modifications, changes, variations, substitutions, and equivalents will be apparent to those skilled in the art, without departing from the spirit and scope of the invention, as described in the claims.

The invention claimed is:

1. A transmission line driver with slew rate control, comprising:
   a high side ramp generator that receives a speed signal and a data signal and generates a charge ramp signal;
   a low side ramp generator that receives the speed signal and the data signal and generates a discharge ramp signal;
   a first comparator having a first input that receives the charge ramp signal, a second input that receives a first reference voltage signal, and a first comparator output signal;
   a second comparator having a first input that receives the discharge ramp signal, a second input that receives a second reference voltage signal, and a second comparator output signal;

an NMOS source follower transistor having a gate connected to the high side ramp generator and receiving the charge ramp signal, and a drain connected to a first voltage level;

a PMOS source follower transistor having a gate connected to the low side ramp generator and receiving the discharge ramp signal, a drain connected to a ground, and a source connected to a source of the NMOS source follower transistor, wherein a node between the sources of the NMOS and PMOS source follower transistors is an output node;

a pair of additional drivers including a PMOS transistor having a gate connected to the first comparator and receiving the first comparator output signal, and a source connected to the first voltage level, and a NMOS transistor having a gate connected to the second comparator and receiving the second comparator output signal, a source connected to the ground, and a drain connected to a drain of the PMOS additional transistor and the output node; and a pair of staggered drivers including a PMOS transistor having a gate connected to the first comparator and receiving the first comparator output signal, a source connected to the first voltage level, and a drain connected to the output node, and a NMOS transistor having a gate connected to the second comparator and receiving the second comparator output signal, a source connected to the ground, and a drain connected to the output node.

2. The transmission line driver of claim 1, further comprising a first resistor connected between the gate of the PMOS staggered transistor and the first comparator and a second resistor connected between the gate of the NMOS staggered transistor and the second comparator.

3. The transmission line driver of claim 2, wherein the first and second resistors are about 1 kΩ each.

4. The transmission line driver of claim 1, wherein the first reference voltage signal is about 2.6 V.

5. The transmission line driver of claim 4, wherein the second reference voltage signal is about 660 mV.

6. The transmission line driver of claim 1, wherein the high side ramp generator comprises:
a PMOS transistor having a source, a gate that receives the data signal, and a drain;
a NMOS transistor having a source connected to the ground, a gate that receives the data signal, and a drain connected to the drain of the PMOS transistor;
a current source connected between the first voltage level and the source of the PMOS transistor; and
a capacitor having a first terminal connected to a node between the drains of the PMOS and NMOS transistors, and a second terminal connected to the source of the NMOS transistor, wherein the charge ramp signal is generated at the node between the drains of the NMOS and PMOS transistors.

7. The transmission line driver of claim 6, wherein the low side ramp generator comprises:
a PMOS transistor having a source connected to the first voltage level, a gate that receives the data signal, and a drain;
a NMOS transistor having a gate that receives the data signal, a drain connected to the drain of the PMOS transistor, and a source;
a current source connected between the ground and the source of the NMOS transistor; and
a capacitor having a first terminal connected to a node between the drains of the PMOS and NMOS transistors, and a second terminal connected to the current source, wherein the discharge ramp signal is generated at the node between the drains of the NMOS and PMOS transistors.

8. The transmission line driver of claim 7, wherein the speed signal changes a mode of operation of the transmission line driver between a high speed mode and a low speed mode.

9. The transmission line driver of claim 8, wherein the high speed mode is about 12 Mbps and the low speed mode is about 1.5 Mbps.

10. A transmission line driver with slew rate control, comprising:
a high side ramp generator that receives a speed signal and a data signal and generates a charge ramp signal;
a low side ramp generator that receives the speed signal and the data signal and generates a discharge ramp signal;
a first comparator having a first input that receives the charge ramp signal, a second input that receives a first reference voltage signal, and a first comparator output signal;
a second comparator having a first input that receives the discharge ramp signal, a second input that receives a second reference voltage signal, and a second comparator output signal;
an NMOS source follower transistor having a gate connected to the high side ramp generator and receiving the charge ramp signal, and a drain connected to a first voltage level;
a PMOS source follower transistor having a gate connected to the low side ramp generator and receiving the discharge ramp signal, a drain connected to a ground, and a source connected to a source of the NMOS source follower transistor, wherein a node between the sources of the NMOS and PMOS source follower transistors is an output node;
a pair of additional drivers including a PMOS transistor having a gate connected to the first comparator and receiving the first comparator output signal, and a source connected to the first voltage level, and a NMOS transistor having a gate connected to the second comparator and receiving the second comparator output signal, a source connected to the ground, and a drain connected to a drain of the PMOS additional transistor and the output node; and
a pair of staggered drivers including a PMOS transistor having a gate connected to the first comparator by way of a first resistor and receiving the first comparator output signal, a source connected to the first voltage level, and a drain connected to the output node, and a NMOS transistor having a gate connected to the second comparator by way of a second resistor and receiving the second comparator output signal, a source connected to the ground, and a drain connected to the output node.

11. The transmission line driver of claim 10, wherein the first and second resistors are about 1 kΩ each.

12. The transmission line driver of claim 10, wherein the first reference voltage signal is about 2.6 V.

13. The transmission line driver of claim 12, wherein the second reference voltage signal is about 660 mV.

14. The transmission line driver of claim 10, wherein the high side ramp generator comprises:
a PMOS transistor having a source, a gate that receives the data signal, and a drain;

a NMOS transistor having a source connected to the ground, a gate that receives the data signal, and a drain connected to the drain of the PMOS transistor;

a current source connected between the first voltage level and the source of the PMOS transistor; and a capacitor having a first terminal connected to a node between the drains of the PMOS and NMOS transistors, and a second terminal connected to the ground, wherein the charge ramp signal is generated at the node between the drains of the NMOS and PMOS transistors.

15. The transmission line driver of claim 14, wherein the low side ramp generator comprises:

a PMOS transistor having a source connected to the first voltage level, a gate that receives the data signal, and a drain;

a NMOS transistor having a gate that receives the data signal, a drain connected to the drain of the PMOS transistor, and a source;

a current source connected between the ground and the source of the NMOS transistor; and a capacitor having a first terminal connected to a node between the drains of the PMOS and NMOS transistors, and a second terminal connected to the current source, wherein the discharge ramp signal is generated at the node between the drains of the NMOS and PMOS transistors.

16. The transmission line driver of claim 15, wherein the speed signal changes a mode of operation of the transmission line driver between a high speed mode and a low speed mode.

17. The transmission line driver of claim 16, wherein the high speed mode is about 12 Mbps and the low speed mode is about 1.5 Mbps.

* * * * *